United States Patent
Yates et al.

(10) Patent No.: US 7,307,306 B2
(45) Date of Patent: *Dec. 11, 2007

(54) ETCH MASK AND METHOD OF FORMING A MAGNETIC RANDOM ACCESS MEMORY STRUCTURE

(75) Inventors: Donald L. Yates, Boise, ID (US); Karen T Signorini, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/426,768

(22) Filed: Jun. 27, 2006

(65) Prior Publication Data

US 2006/0263911 A1 Nov. 23, 2006

Related U.S. Application Data

(63) Continuation of application No. 10/789,381, filed on Feb. 27, 2004, now Pat. No. 7,132,299.

(51) Int. Cl.
*H01L 27/108* (2006.01)
*H01L 29/76* (2006.01)
(52) U.S. Cl. .............................. 257/296; 257/E21.038
(58) Field of Classification Search ............... 257/296, 257/E21.038
See application file for complete search history.

(56) References Cited

U.S. PATENT DOCUMENTS

| | | | |
|---|---|---|---|
| 5,451,543 | A | 9/1995 | Woo et al. |
| 5,817,562 | A | 10/1998 | Chang et al. |
| 6,025,259 | A | 2/2000 | Yu et al. |
| 6,316,370 | B1 | 11/2001 | Mercaldi et al. |
| 6,485,989 | B1 | 11/2002 | Signorini |
| 6,656,372 | B2 | 12/2003 | Yates |
| 7,132,299 | B2 | 11/2006 | Yates et al. |
| 2001/0004553 | A1 | 6/2001 | Mercaldi et al. |
| 2001/0046784 | A1 | 11/2001 | Broekaart et al. |
| 2007/0141844 | A1 | 6/2007 | Yates et al. |

*Primary Examiner*—Asok Kumar Sarkar
(74) *Attorney, Agent, or Firm*—Schwegman, Lundberg & Woessner, P.A.

(57) ABSTRACT

A method for forming an MRAM bit is described that includes providing a covering layer over an integrated circuit structure. In one embodiment, the covering layer includes tantalum. A first mask layer is formed over the covering layer followed by a second mask layer. The first mask layer and second mask layer are etchable by the same etching process. The first and second mask layer are etched. Etch residue is removed from the first and second mask layers. The first mask layer is then selectively removed and the second mask layer remains.

30 Claims, 6 Drawing Sheets

ETCH MASK AND METHOD OF FORMING A MAGNETIC RANDOM ACCESS MEMORY STRUCTURE

RELATED APPLICATION

This application is a Continuation of U.S. application Ser. No. 10/789,381 filed Feb. 27, 2004, now U.S. Pat. No. 7,132,299. This application is incorporated herein by reference.

TECHNICAL FIELD

The present invention relates generally to magnetic random access memory, and in particular to defining magnetic random access memory bit etch masks.

BACKGROUND

During the 1950s and 1960s, magnetic core memories were the predominant storage technology for the working memory of computing systems. The magnetic core memory technology was costly. In the 1970s, magnetic core memories were replaced with integrated circuits, including dynamic random access memory (DRAM) and including static random access memory (SRAM). Non-volatile memories, such as FLASH memory for example, have been developed to address the problem of data volatility. Because of the rapid advancement in semiconductor density coupled with the advent of the DRAM cell, magnetic storage technology was not used for high-speed on-line memory, but rather was left to be used for low-cost, high-density memory in the form of various disk drive technologies.

The semiconductor industry continuously strives to reduce the size and cost of memory, increase the speed for accessing memory, and improve the reliability of memory. One particular problem confronting the semiconductor industry is that of reducing the size of the memory cell in a Random Access Memory (RAM).

Magnetic storage such as Magnetic Random Access Memory (MRAM) technology has been proposed as a replacement or supplement to the DRAM. In the MRAM structures that are being proposed, the capacitor storage element of the DRAM cell is replaced by a magnetic element that has a magnetic moment and is characterized by a predominant or easy axis of magnetization. In the absence of an external magnetic field, the magnetic moment is oriented along the easy axis of magnetization in one of two stable states. In magnetoresistance technology, one of the stable states for the magnetic moment of the magnetic element is a high resistance state and the other of the stable states is a low resistance state.

Conventional etching processes for MRAM have been found to be too aggressive which results in etching layers that are not intended to be etched. Unintentional etching may create undesirable residues such as metals, metal alloys, etc., which in some applications include tantalum (Ta). The residues have been found to form footings adjacent the bases of bit masks. Aggressive etching techniques must be employed to remove the footings. However, aggressive etching causes further unwanted etching of MRAM layers. Etching of the MRAM layers may cause shorting of the MRAM bit or create a defective device.

Without the aggressive etching techniques mentioned above the footings remain adjacent the bit mask base. The presence of footings negatively affects critical dimensions (CD) of the MRAM bit etch mask, which are the desired shape and size of the mask layer. An unintentionally large MRAM bit created because of footing issues may exceed dimensioning tolerances and thus contact other MRAM bits, which degrades performance and may prevent MRAM function, or other integrated circuit structure function.

Therefore, there is a need in the art to overcome the problems attributable to defining an MRAM bit etch mask.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

It is noted that for purposes of interpreting this disclosure and the claims that follow, the spacial reference terms "on", "over", "above", "beneath" and the like are utilized to describe relative orientations of various elements to one another. The terms are not utilized in an absolute and global sense relative to any external reference. Accordingly, a first material recited as being "beneath" a second material defines a reference of the two materials to one another, but does not mean that the first material would actually be "under" the second material relative to any reference external of the two materials.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art.

Figure 1:
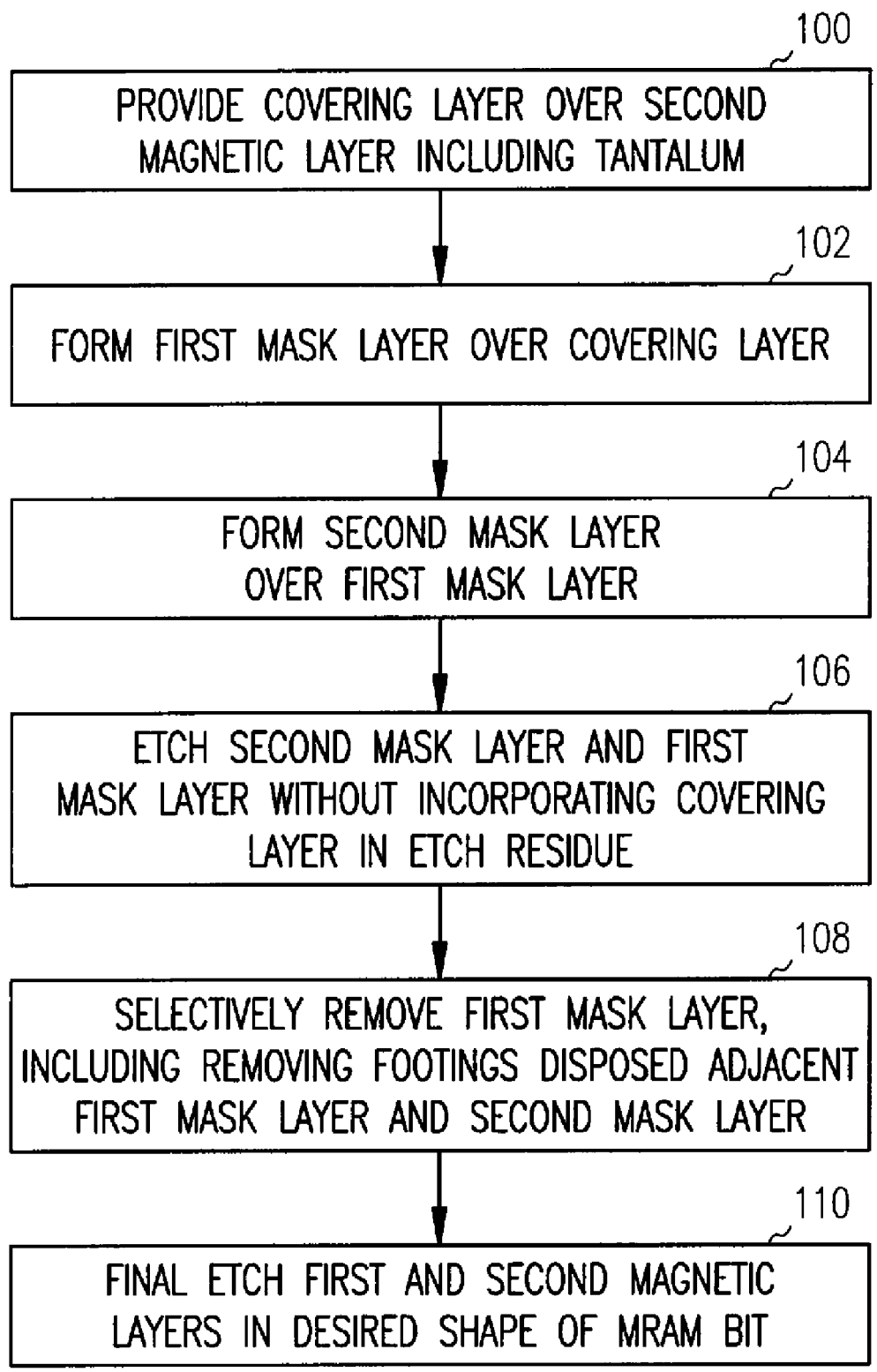
FIG. 1 is a block diagram illustrating one embodiment of a method according to the teachings of the present invention.

FIG. 1 is a block diagram illustrating generally, a method of forming an MRAM bit. At 100, a covering layer is provided over a magnetic layer. In an embodiment, the covering layer includes tantalum. At 102, a first mask layer is formed over the covering layer. The first mask layer includes titanium nitride, in an embodiment. In another embodiment, the first mask layer includes silicon nitride. A second mask layer is formed over the first mask layer at 104. In an embodiment the second mask layer includes dielectric anti-reflective coating (DARC). In another embodiment the second mask layer includes siline oxides. At 106, the first mask layer and second mask layer are etched. In an embodiment, the first and second mask layer are etched in order to pattern the second mask layer. The covering layer is not included in the etch residue. In other words, the etchant used to etch the first mask layer and second mask layer 106 does not reach the covering layer, thus the etch residue does not include material from the covering layer. To put it another way, the first mask layer helps prevent incorporation of material from the covering layer into the etch residue. In still another embodiment, the first mask layer (including silicon nitride, titanium nitride or titanium) and second mask layer are dry etched, for example by plasma etching with a reactive gas. In yet another embodiment, the first mask layer (including titanium or titanium nitride) and second mask layer are wet etched. At 108, portions of the first mask layer, footings disposed adjacent to the first mask layer, and etch residues are removed with, for example, an ammonium hydroxide peroxide solution. In one embodiment, the solution is applied to the first and second mask layers at around 65 degrees Celsius. In this embodiment, the patterned portion of the second mask layer remains in the shape of an MRAM bit and the remaining first mask layer is undercut with respect to the second mask layer. At 110, a final etch is provided to pattern the magnetic layers into the desired shape of an MRAM bit according to the pattern of the second mask layer. In an embodiment, the first mask layer and second mask layer are then removed with a chemical and mechanical planarization process, for example polishing and grinding to leave a defined MRAM bit. In another embodiment, the first mask layer and the second mask layer remain and serve as dielectrics between the MRAM bit and other chip elements.

Figure 2:
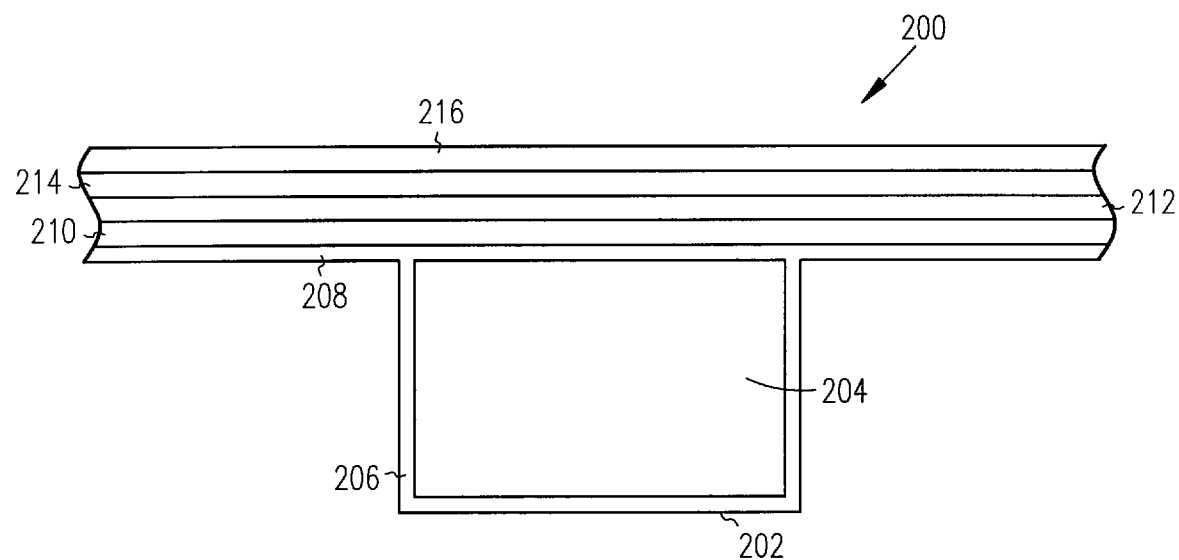
FIG. 2 is a sectional view illustrating one embodiment of an unfinished memory cell including a substrate, barrier, conductor, magnetic layers and interposing layers.

FIG. 2 is a sectional view of a substrate 200 and various layers described below. In an embodiment, the substrate 200 is a silicon base used in semiconductor devices. A channel 202 is formed in the substrate for a conductor line 204. In one embodiment, the conductor line 204 includes a conductive material, for example copper. A barrier 206 is interposed between the channel 202 and the conductor line 204. In an embodiment the barrier 206 includes tantalum. A first interposing layer 208 is formed over the conductor line 204, barrier 206, and substrate 200. The first interposing layer 208 includes tantalum, in one embodiment. A first magnetic layer 210 is disposed above the interposing layer 208. In an embodiment, the magnetic layer 210 includes a ferrous material, for example cobalt, iron, nickel, manganese and/or other transition metals. A second interposing layer 212 is disposed over the first magnetic layer 210. In one embodiment, the second interposing layer 212 includes aluminum oxide. In another embodiment, a second magnetic layer 214 is disposed over the second interposing layer 212. In an embodiment, the second magnetic layer 214 includes similar materials as described above with respect to the first magnetic layer 210. In another embodiment, the second magnetic layer 214 includes materials distinct, at least in part, from those included in the first magnetic layer 210. A covering layer 216 is provided over the second interposing layer 212. In one embodiment, the covering layer 216 includes tantalum. The layers 208, 210, 212, 214 and 216 are deposited over the conductor line 204, barrier 206, and substrate 200, by chemical vapor deposition, in an embodiment.

Figure 3:
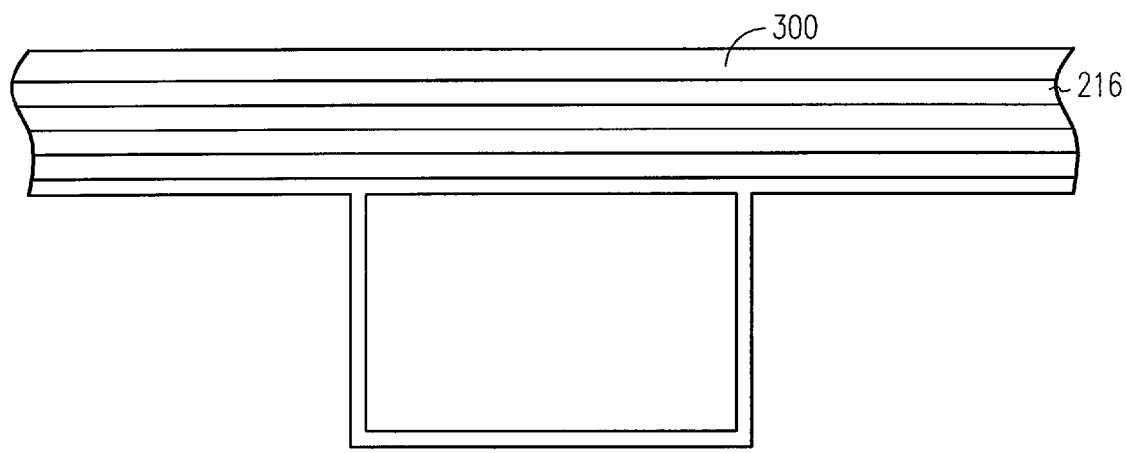
FIG. 3 is a sectional view illustrating one embodiment of an unfinished memory cell having a first mask layer.
Figure 4:
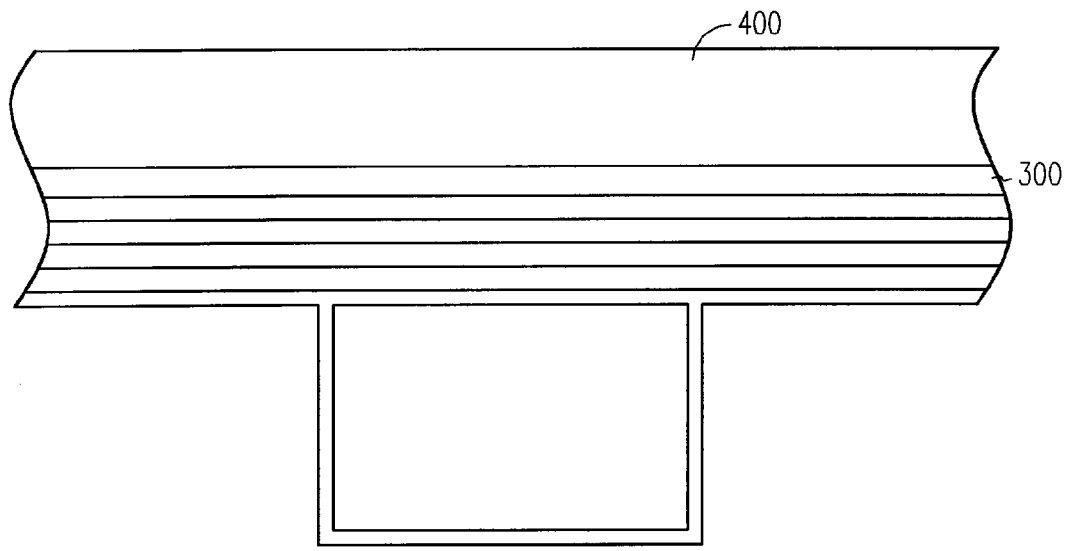
FIG. 4 is a sectional view illustrating one embodiment of an unfinished memory cell having a first and second mask layer.

FIGS. 3 through 8 are sectional views of the substrate 200 and various layers 208, 210, 212 and 214. Additionally, mask layers, etchings, and selective removals of residues and mask layers are also shown in FIGS. 3 through 8. In FIG. 3, a first mask layer 300 is provided over the covering layer 216. In an embodiment, the first mask layer 300 includes at least one of titanium nitride (TiN), titanium (Ti), or silicon nitride (SiN). In another embodiment, the first mask layer 300 is deposited over the covering layer 216 by a spinning process. As shown in the sectional view of FIG. 4, a second mask layer 400 is disposed over the first mask layer 300. In one embodiment, the second mask layer 400 is applied in a similar manner as the first mask layer 300 (e.g. by spinning). In an embodiment, the second mask layer 400 includes a dielectric anti-reflective coating (DARC). In another embodiment, the second mask layer 400 includes siline oxides. In this embodiment, the second mask layer 400 is patterned with a positive photoresist applied over the second mask layer. The photoresist is exposed to a known light wave length for a set amount of time to define a pattern around the desired MRAM bit, thereby photosolubilizing the surrounding photoresist. The photosolubilized resist is subsequently removed in a developing step with, for example, a solution of tetramethyl ammonium hydroxide. The insoluble photoresist defined in the MRAM pattern remains and is used to pattern the second mask layer in an etching step (described herein).

Figure 5:
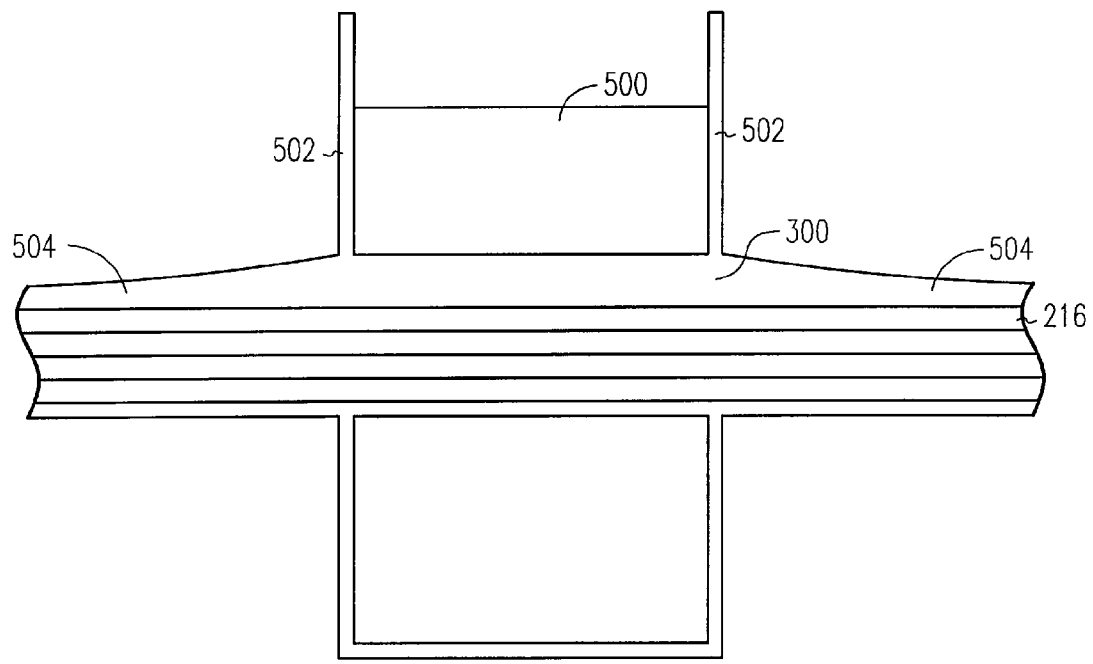
FIG. 5 is a sectional view illustrating one embodiment of an unfinished memory cell after a first etch.

FIG. 5 is another sectional view, of the second mask layer 400 and first mask layer 300 after an etching step. In an embodiment, the second mask layer 400 and first mask layer 300 are etched in the shape of the MRAM bit because the insoluble photoresist remains (described above). The etchant selectively etches around the insoluble photoresist and correspondingly patterns the second mask layer 400 into a patterned portion 500. The first mask layer 300 is also partially etched in this step. In one embodiment, a dry, or plasma etch is performed wherein energized ions chemically dissolve portions of the mask layers 300, 400 in the manner described above. The insoluble photoresist used to pattern the first and second mask layers 300, 400 is removed with solutions capable of breaking down the insoluble photoresist.

The etch extends through the second mask layer and stops within the first mask layer 300. The etch does not reach the covering layer 216. In an embodiment, the covering layer 216 includes tantalum. In this embodiment, because the etch stops within the first mask layer 300, tantalum is not incorporated within an etch residue 502. Instead the etch residue 502 incorporates the materials of the first mask layer 300 and second mask layer 400. The first mask layer 300 includes uneven footings 504 including mask material and etch residue that are disposed adjacent to the first mask layer 300 and the patterned portion 500.

Figure 6:
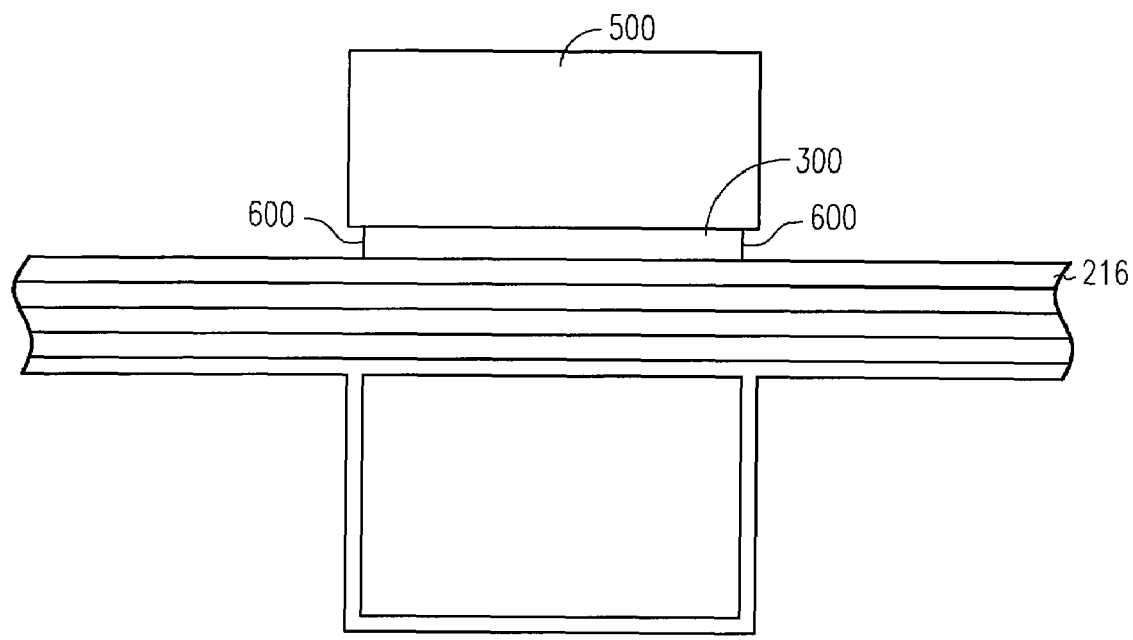
FIG. 6 is a sectional view illustrating one embodiment of an unfinished memory cell after a wet removal of etch residues and a portion of the first mask layer.

As shown in FIG. 6, a sectional figure showing the patterned portion 500 and first mask layer 300, the etch residue 502 and footings 504 are removed. In one embodiment, where the first mask layer includes titanium nitride or titanium, a solution of hydrochloric acid is used to remove the etch residue 502 and footings 504. In another embodiment, an ammonium peroxide mixture, for example ammonium hydroxide peroxide, is used to remove the etch residue 502 and footings 504. Because the covering layer 216 is not incorporated in the etch residue 502, removal of the residue is straightforward and less difficult with these solutions. In other words, incorporation of the covering layer 216, including tantalum for example, in the etch residue 502 makes removal of the residue more difficult and requires additional steps, which are not needed in the present invention, in order to proceed with the other steps of forming an MRAM bit. In another embodiment, after the etch residue 502 is removed, plasma removal or ion milling is performed to remove the footings 504. Using the solutions, plasma removal, or ion milling slightly undercuts the patterned portion 500. As shown by the undercuts 600, the patterned portion 500 is partially cantilevered above the covering layer 216 and extends from the first mask layer 300. After removal of the footings 504 and undercutting of the first mask layer 300, the remaining first mask layer and patterned portion cleanly define the MRAM bit etch mask.

Figure 7:
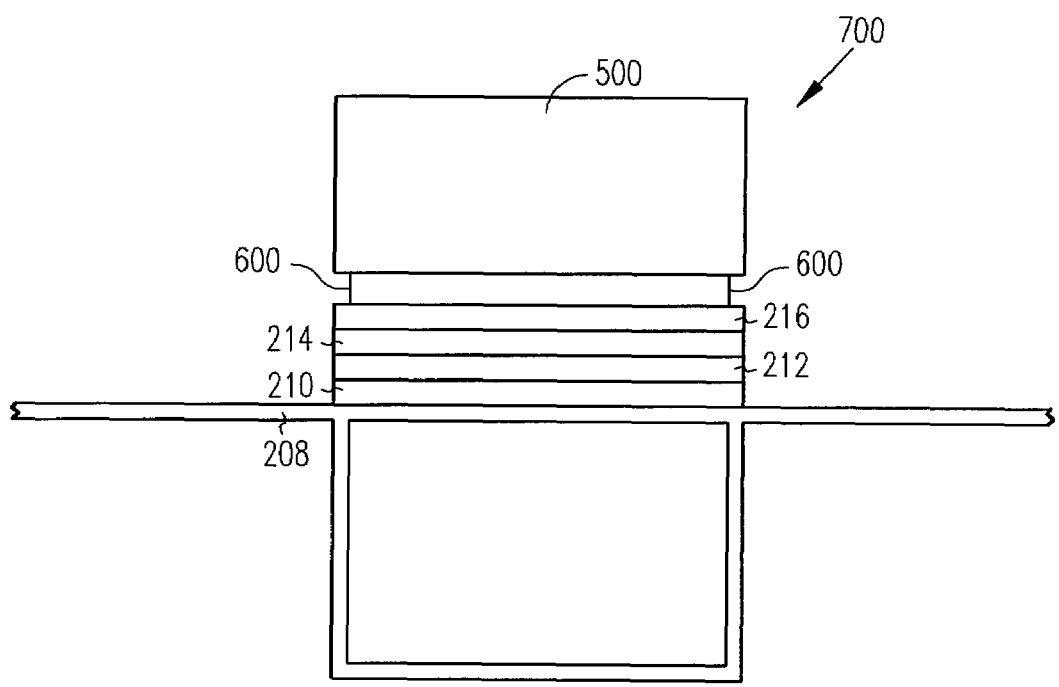
FIG. 7 is a sectional view illustrating one embodiment of a memory cell after a final etch.

In FIG. 7, the covering layer 216, first and second magnetic layers 210, 214, and second interposing layer 212 are etched in the pattern of the patterned portion 500 of the second mask layer 400 to define the MRAM bit 700. In an embodiment, the layers 210, 212, 214, 216 are etched with a reactive ion etching process or plasma etching. Because the footings 504 are removed and the first mask layer 300 is undercut, layers 210, 212, 214, 216 are etched according to the dimension of the patterned portion 500. In other words, if the footings 504 were present and there were no undercuts 600, the layers 210, 212, 214, 216 would be potentially patterned according to the rough pattern defined by uneven footings and the patterned portion 500. That is to say, an MRAM bit formed through etching around such an etch mask may be larger and/or rougher than desired. Critical dimensions would be exceeded. The removal of the footings 504 and slight undercutting to precisely define the MRAM bit etch mask thus provides exacting control over the desired critical dimensions of the MRAM bit.

Figure 8:
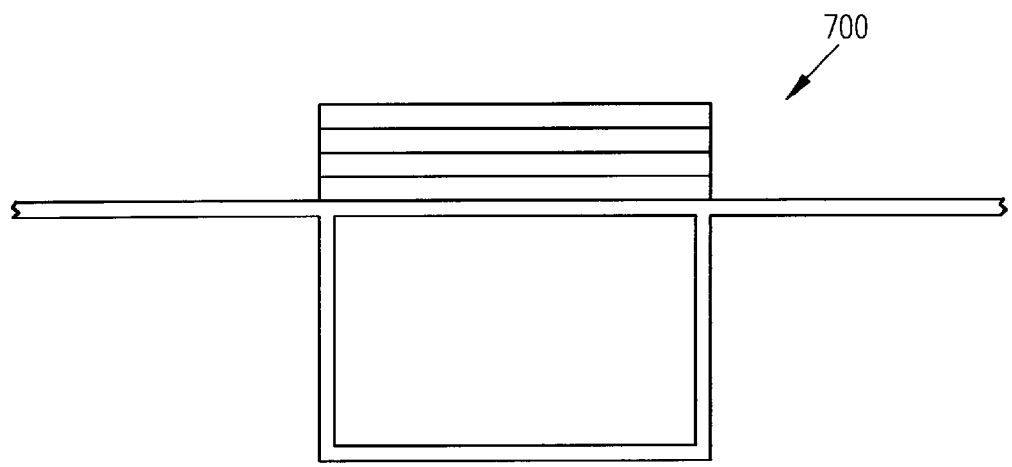
FIG. 8 is a sectional view illustrating one embodiment of a memory cell after removal of mask layers.

In one embodiment, as shown in the sectional view of FIG. 8, the first mask layer 300 and patterned portion 500 are removed and the finished MRAM bit 700 remains. In an embodiment, the first mask layer 300 and patterned portion 500 are removed with chemical and mechanical planarization processes, for example, polishing and grinding. In another embodiment, the first mask layer 300 and patterned portion 500 are removed with a dry etch, for example a plasma etch with a reactive gas. In still another embodiment, the patterned portion 500 and/or first mask layer 300 are left (as shown in FIG. 7) and serve as dielectrics between the MRAM bit and other chip elements, for example an additional conductor line.

Figure 9:
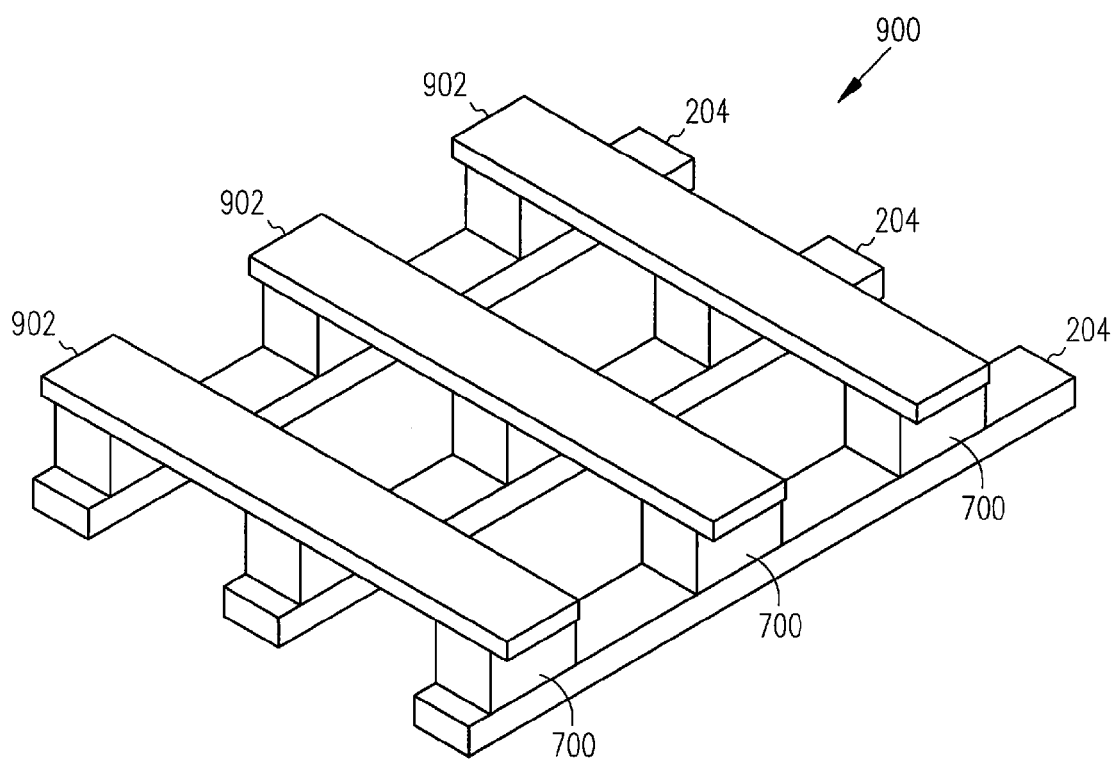
FIG. 9 is a perspective view illustrating one embodiment of a cross point array for MRAM.

As shown in the perspective view in FIG. 9, in an embodiment, multiple MRAM bits 700 are included in a cross point array 900 of magnetic memory. The cross point array 900 of magnetic memory is useable in a Random Access Memory (RAM). The MRAM bit 700 is used in place of or as a supplement to conventional storage elements, for example, DRAM. The cross point array 900 includes first conductor lines 204, and second conductor lines 902, and MRAM bits 700 stored therebetween. The illustrated layer of first conductor lines 204 defines a plurality of parallel or approximately parallel word lines. The layer of second conductor lines 902 defines a plurality of parallel or approximately parallel bit lines. The bit lines are orthogonal or approximately orthogonal, albeit in a different plane, to the word lines 108, as is evident in the illustration of FIG. 9.

Each MRAM bit 700 has a magnetic moment and is characterized by a predominant or easy axis of magnetization. In the absence of an external magnetic field, the magnetic moment is oriented along the easy axis of magnetization in one of two stable states. In magnetoresistance technology, one of the stable states for the magnetic moment of the magnetic element is a high resistance state and the other of the stable states is a low resistance state. The conductor lines 204, 902 (word and bit lines) cooperatively orient the magnetic moment via magnetic flux generated by the respective currents in the conductor lines. Selective orientation of the magnetic flux allows the MRAM bits 700 to serve as storage elements.

Figure 10:
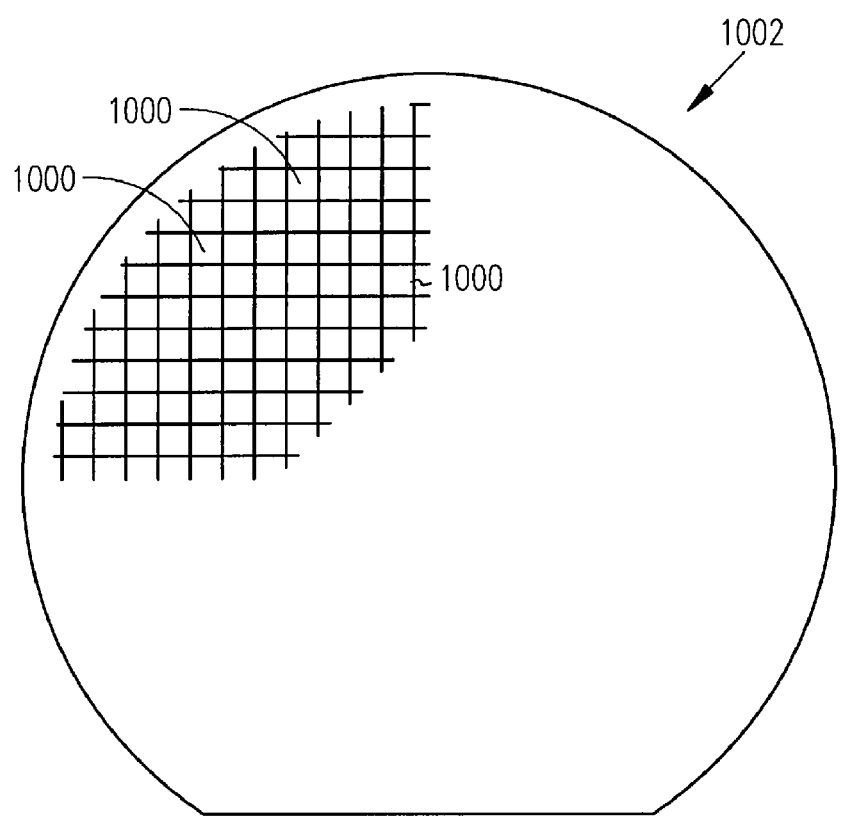
FIG. 10 is a plan view of a wafer containing semiconductor dies according to the present invention.

With reference to FIG. 10, for an embodiment, a semiconductor die 1000 is produced from a substrate such as a wafer 1002. A dies in an individual pattern, typically rectangular, on a substrate that contains circuitry, or integrated circuit devices (for example MRAM bits 700), to perform a specific function, such as memory functions, logic functions, and address functions. A semiconductor wafer will typically contain a repeated pattern of such dies containing the same functionality. Dies 1000 contain circuitry for the I/O device created with the inventive method, as discussed herein. Die 1000 may further contain additional circuitry to extend to such complex devices as a monolithic process with multiple functionality. Die 1000 is typically packaged in a protective casing (not shown) with leads extending therefrom (not shown) providing access to the circuitry of the die for unilateral or bilateral communication and control. Each die 1000 may contain at least one of the I/O devices patterned with the method according to the present invention.

Figure 11:
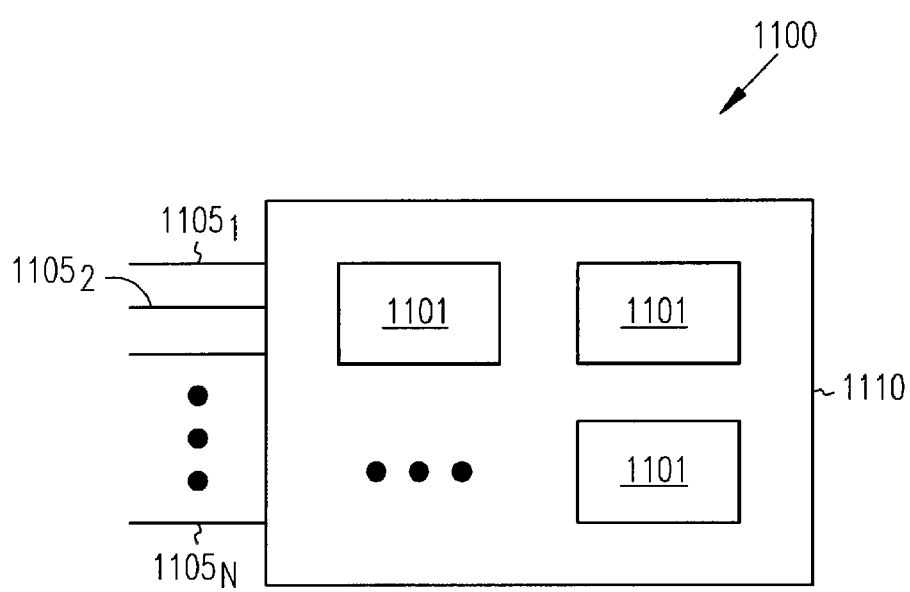
FIG. 11 is a schematic view of an electronic device according to an embodiment of the present invention.

As shown in FIG. 11, two or more dies, typically packaged, 1101 of the present invention may be combined, with or without protective casing, into a circuit module 1100 to enhance or extend the functionality of an individual die 1101. At least one die 1101 includes a memory cell, vertical transistor, or interlevel signal line formed according to the present invention. Circuit module 1100 may include combination of dice 1101 representing a variety of functions, or a combination of dice 1101 containing the same functionality. In an embodiment, circuit module 1100 includes at least one socket, slot, recess, mounting site or the like into which the die 1101 is received. Some examples of a circuit module include memory modules, device drivers, power modules, communication modems, processor modules and application-specific modules, and may include multilayer, multichip modules. Such modules will have a chip receiver in which a chip according to the present invention is inserted. Circuit module 1100 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 1100 will have a variety of leads $1105_1$ through $1105_N$ extending therefrom. The leads $1105_1$ through $1105_N$ are adapted to connect the circuit module to other electrical circuits to provide an interface for unilateral or bilateral communication and control. Some examples of an interface that is a user interface include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. A user interface may further describe access ports provided to an electronic system. Access ports are used to connect an electronic system to the more tangible user interface components previously exemplified. One or more of the circuit modules maybe a processor providing some form of manipulation, control or direction of inputs from or outputs to a user interface , or of other information either preprogrammed into, or otherwise provided to, an electronic system. As will be apparent from the lists of examples previously given, an electronic system will often be associated with certain mechanical components (not shown) in addition to a circuit module and a user interface. It will be appreciated that one or more circuit modules in an electronic system can be replaced by a single integrated circuit. Furthermore, an electronic system may be a subcomponent of a larger electronic system.

CONCLUSION

The present invention provides methods for patterning an MRAM bit etch mask. Additionally, the methods disclosed are applicable to similar patterning techniques for integrated circuit fabrication. Incorporation of covering layer materials into etch residues makes residue cleanup difficult and possibly damaging to an MRAM bit. In one example, a covering layer for an MRAM bit includes tantalum. When etching the mask layer, etchant that contacts the covering layer incorporates material (for example, tantalum) into the etch residue. Etch residue incorporating tantalum is difficult to remove and often requires aggressive solutions. When removing tantalum incorporating residues, these aggressive solutions can undesirably damage the MRAM bit, and in some cases short out the magnetic layers.

The use of an additional mask layer (for example silicon nitride (SiN)) between the covering layer and the upper mask layer aids, to some degree, with preventing incorporation of the covering layer in etch residue. However, using an additional mask layer allows footings (including mask material and etch residue) to form adjacent to the desired patterned mask layers. Footings negatively affect the critical dimensions of the MRAM bit, that is, the desired shape and size of the bit. The undesirable footings can cause the MRAM bit to exceed dimensioning tolerances and contact other MRAM bits thus degrading performance and possibly preventing MRAM function. Removal of footings requires aggressive solutions that can damage the MRAM bit.

The method of the present invention addresses these problems and provides an improvement in the art by providing a multiple layer mask that helps prevent incorporation of the covering layer in etch residues and also allows for critical dimension control. In an embodiment, a first mask layer is formed over a covering layer. A second mask layer is formed over the first mask layer, in an embodiment. The first and second mask layers are etched. In an embodiment, the etch residue is removed from the remaining first mask layer and the second mask layer. With this method, when the first and second mask layers are etched, material from the covering layer is not incorporated into the etch residue. In other words, the first mask layer substantially prevents incorporation of materials from the covering layer into the etch residue. In effect, the first mask layer is used to "tune" etch residues, meaning incorporation of undesired materials (tantalum for example) into etch residues is decreased or entirely prevented.

The first mask layer is selectively removed and the second mask layer remains. In an embodiment, the first mask layer includes titanium nitride, titanium or silicon nitride. In an embodiment, selective removal of the first mask layer (including TiN or Ti, for example) is accomplished with a wet removal with, for example, ammonium peroxide. The selective removal of the first mask layer removes the footings and also provides an undercut of the first mask layer with respect to the second mask layer. Critical dimension control of the patterned MRAM bit is preserved with the removal of the footings and the slight undercut. Further, the etching of the first and second mask layer and selective removal of the first mask layer does not require aggressive solutions that otherwise would damage the MRAM bit.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope of the invention should, therefore, be determined with reference to the appended claims, along with the full scope of equivalents to which such claims are entitled.

What is claimed is:

1. An etch mask, comprising:
   a covering layer over an integrated circuit structure having a top layer;
   a first mask layer over the covering layer;
   a second mask layer over the first mask layer, the first and second mask layers being etchable by a same etching process, and the first mask layer being selectively removable by a process different than the same etching process; and
   wherein the second mask layer includes a patterned portion extending over undercuts in the first mask layer.

2. The etch mask of claim 1, wherein the covering layer includes tantalum.

3. The etch mask of claim 1, wherein the first mask layer includes titanium nitride.

4. The etch mask of claim 3, wherein the first mask layer is selectively removable by the process different than the same etching process including an ammonium peroxide mixture wet removal.

5. The etch mask of claim 1, wherein the first mask layer is selectively removable by the process different than the same etching process including a plasma removal.

6. The etch mask of claim 1, wherein the first mask layer is etched through an upper first mask surface without etching though a lower first mask surface with the same etching process.

7. The etch mask of claim 1, wherein the second mask layer includes dielectric anti-reflective coating.

8. The etch mask of claim 1, wherein the second mask layer includes siline oxides.

9. An etch mask, comprising:
   a first mask layer over a covering layer of an integrated circuit structure, wherein the first mask layer includes an upper first mask surface and a lower first mask surface;
   a second mask layer over the first mask layer, wherein the second mask layer includes an upper second mask surface and a lower second mask surface, and the first and second mask layers are etchable by a same etching process, and the first mask layer is selectively removable by a process different than the same etching process; and
   wherein the second mask layer includes an etched portion between the upper and lower second mask surfaces, and the upper first mask layer includes an etched portion etched through the upper first mask surface without etching though the lower first mask surface.

10. The etch mask of claim 9, wherein the covering layer includes tantalum.

11. The etch mask of claim 9, wherein the first mask layer includes titanium nitride.

12. The etch mask of claim 11, wherein the first mask layer is selectively removable by the process different than the same etching process including an ammonium peroxide mixture wet removal.

13. The etch mask of claim 9, wherein the first mask layer is selectively removable by the process different than the same etching process including ion milling.

14. The etch mask of claim 9, wherein the second mask layer includes dielectric anti-reflective coating.

15. The etch mask of claim 9, wherein the second mask layer includes a patterned portion extending over undercuts in the first mask layer.

16. An etch mask, comprising:
a covering layer over an integrated circuit structure having a top layer;
a first mask layer over the covering layer;
a second mask layer over the first mask layer, and the first and second mask layers are etchable by a same etching process;
means for preventing incorporation of the covering layer in an etch residue along the first mask layer and second mask layer; and
means for forming the etch mask around the second mask layer without the first mask layer.

17. The etch mask of claim 16, wherein the means for preventing incorporation of the covering layer in the etch residue includes the first mask layer, and the first mask layer is interposed between the etch residue and the covering layer.

18. The etch mask of claim 16, wherein the means for forming the etch mask includes undercuts in the first mask layer extending underneath at least a portion of the second mask layer.

19. The etch mask of claim 18, wherein at least the portion of the second mask layer includes the perimeter of the second mask layer.

20. The etch mask of claim 18, wherein the first mask layer is selectively removable by a process different than the same etching process including ion milling.

21. An etch mask, comprising:
a covering layer over an integrated circuit structure;
a first mask layer over the covering layer; and
a second mask layer over the first mask layer, the first and second mask layers being etchable by a same etching process, and the first mask layer being selectively removable by a process different than the same etching process an etch residue extending along at least portions of the first mask layer and the second mask layer, and the etch residue is separated from the covering layer.

22. The etch mask of claim 21, wherein the etch residue includes footings adjacent to at least the first mask layer.

23. The etch mask of claim 22, wherein the footings are selectively removable by the process different than the same etching process.

24. The etch mask of claim 21, wherein the first mask layer includes undercuts extending along a perimeter of the second mask layer and adjacent to a lower second mask surface.

25. An etch mask comprising:
a covering layer over an integrated circuit structure;
a barrier over the covering layer;
at least one mask layer over the barrier, the mask layer etched by an etching process, and the barrier partially etched with the same etching process, the barrier isolating the covering layer from the etching process, and the barrier selectively removable by a process different than the same etching process; and
a patterned etch mask perimeter extending around the mask layer, the patterned etch mask perimeter extending outside the barrier.

26. The etch mask of claim 25, wherein the barrier includes at least one undercut, and the patterned etch mask perimeter extends over the undercut.

27. The etch mask of claim 25, wherein the barrier includes an upper barrier surface and a lower barrier surface, and the barrier includes an etched portion etched through the upper barrier surface without etching through the lower barrier surface.

28. The etch mask of claim 25, wherein the covering layer includes tantalum.

29. The etch mask of claim 25 further comprising an etch residue extending along at least portions of the barrier and the mask layer, and the barrier separates the etch residue from the covering layer.

30. The etch mask of claim 29, wherein the etch residue is selectively removable by the process different than the same process.

* * * * *

UNITED STATES PATENT AND TRADEMARK OFFICE
CERTIFICATE OF CORRECTION

| | | |
|---|---|---|
| PATENT NO. | : 7,307,306 B2 | Page 1 of 1 |
| APPLICATION NO. | : 11/426768 | |
| DATED | : December 11, 2007 | |
| INVENTOR(S) | : Yates et al. | |

It is certified that error appears in the above-identified patent and that said Letters Patent is hereby corrected as shown below:

In column 8, line 48, in Claim 6, delete "thought" and insert -- through --, therefor.

In column 9, line 3, in Claim 9, delete "though" and insert -- through --, therefor.

In column 10, line 47, in Claim 30, after "same" insert -- etching --.

Signed and Sealed this

Eighth Day of April, 2008

JON W. DUDAS
*Director of the United States Patent and Trademark Office*